(12) United States Patent
Na

(10) Patent No.: US 8,514,639 B2
(45) Date of Patent: Aug. 20, 2013

(54) SEMICONDUCTOR MEMORY DEVICE AND METHOD FOR OPERATING THE SAME

(75) Inventor: Kwang-Jin Na, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 252 days.

(21) Appl. No.: 12/982,648

(22) Filed: Dec. 30, 2010

(65) Prior Publication Data

US 2012/0106278 A1   May 3, 2012

(30) Foreign Application Priority Data

Oct. 29, 2010   (KR) .................. 10-2010-0106784

(51) Int. Cl.
*G11C 7/00*   (2006.01)
(52) U.S. Cl.
USPC ........................................... 365/194
(58) Field of Classification Search
None
See application file for complete search history.

(56) References Cited

U.S. PATENT DOCUMENTS 5,789,958 A * 8/1998 Chapman et al. ............. 327/261
2002/0186064 A1* 12/2002 Ooishi ......................... 327/278

FOREIGN PATENT DOCUMENTS

KR   1019980063365   10/1998
KR   1020070036551   4/2007

* cited by examiner

*Primary Examiner* — Hoai V Ho
*Assistant Examiner* — James G Norman
(74) *Attorney, Agent, or Firm* — IP & T Group LLP

(57) ABSTRACT

A semiconductor memory device includes a plurality of banks, a clock input unit configured to receive an external data clock, an internal data clock generation unit configured to receive the external data clock from the clock input unit and generate an internal data clock by delaying the external data clock by a delay amount which changes in correspondence to the number of banks activated among the plurality of banks, and a data buffer unit configured to buffer a data signal in response to the internal data clock.

16 Claims, 4 Drawing Sheets

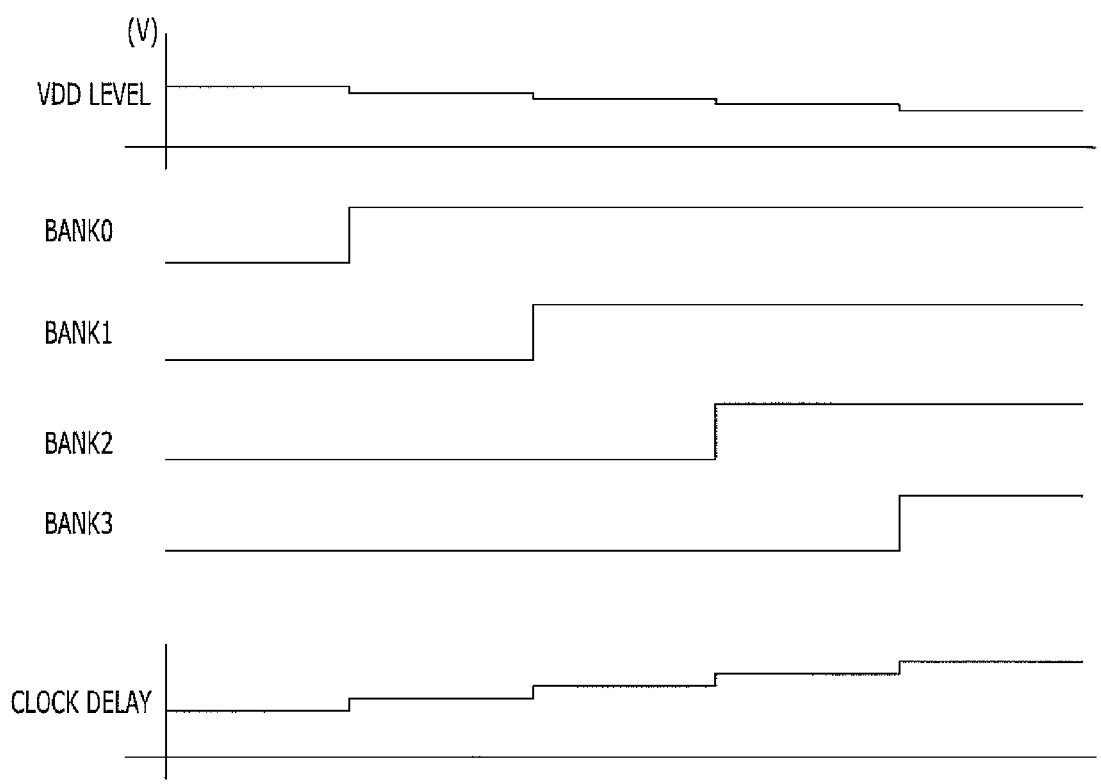

SEMICONDUCTOR MEMORY DEVICE AND METHOD FOR OPERATING THE SAME

CROSS-REFERENCE TO RELATED APPLICATION

The present application claims priority of Korean Patent Application No. 10-2010-0106784, filed on Oct. 29, 2010, which is incorporated herein by reference in its entirety.

BACKGROUND OF THE INVENTION

Exemplary embodiments of the present invention relate to semiconductor design technology, and more particularly, to a semiconductor memory device which is capable of correcting a phase of a clock used to input and output data according to the number of activated banks.

Semiconductor memory devices are used to store data. When a data processor, such as a memory control unit (MCU), requests data, a semiconductor memory device outputs data corresponding to an address inputted from the data requesting device, or stores data provided from the data requesting device at a position corresponding to the address.

A recently developed high-speed memory device is designed to input/output two data between a rising edge and a falling edge of a system clock, and input/output two data between the falling edge and a next rising edge of the system clock. That is, the memory device is designed to input/output four data in one cycle of the system clock.

However, since the system clock has only two states, i.e., a logic high level and a logic low level, a data clock having two times the frequency of the system clock may be required in order to input/output four data in one cycle of the system clock. That is, the data clock dedicated to data transmission may be required.

For example, a high-speed semiconductor memory device uses a system clock as a reference clock for transmission of an address and a command, and uses a data clock as a reference clock for the data transmission by controlling the data clock to have two times the frequency of the system clock.

That is, the data clock may be controlled to have two cycles within one cycle of the system clock, and the data may be inputted or outputted at a rising edge and a falling edge of the data clock. As such, in the high-speed semiconductor memory device, four data may be inputted or outputted in one cycle of the system clock.

The high-speed semiconductor memory device may input/output data by using two clocks having different frequencies in order for a read or write operation, as opposed to a conventional DDR synchronous memory device which uses one system clock as a reference clock to perform a read or write operation.

However, if the phase of the system clock and the phase of the data clock are not aligned, the reference for the transmission of the command and the address and the reference for the data transmission are not aligned. This means that a high-speed semiconductor memory device may not operate normally.

Therefore, in order to secure a reliable operation of the high-speed semiconductor memory device, an interface training operation must be performed between a semiconductor memory device and a data processor in an initial stage of operation.

The interface training operation refers to an operation in which an interface for transmitting a command, an address, and data is initially trained to operate at an optimized timing before an actual operation is performed between the semiconductor memory device and the data processor.

Such interface training operation includes an address training, a clock alignment training, a read training, and a write training. An operation of aligning the data clock and the system clock is performed in the clock alignment training.

FIG. 1 is a timing diagram illustrating a known write training method.

Referring to FIG. 1, an internal data clock WT SYNC. CLK for receiving a write data in a semiconductor memory device is generated by compensating an external data clock EXTERNAL WCLK for an internal asynchronous delay INTERNAL ASYNC DELAY. The internal asynchronous delay INTERNAL ASYNC DELAY is caused in a path through which the external data clock EXTERNAL WCLK is transferred inside the semiconductor memory device. The internal asynchronous delay may be a value which varies depending on pressure, voltage, and temperature (PVT) variations. Therefore, the value may not be previously determined, and instead is determined through the write training.

When the semiconductor memory device is supplied with power and starts its operations, a semiconductor memory device controller and the semiconductor memory device perform the write training. Through the write training, an optimum input timing of a write data may be obtained by delaying the write data based on the external data clock EXTERNAL WCLK. After finding the optimum input timing of the write data WRITE DATA through the write training, the semiconductor memory device controller starts to transmit the write data WRITE DATA to the semiconductor memory device. When the write data WRITE DATA is inputted at the optimum input timing, a sufficient setup hold time based on the internal data clock WT SYNC. CLK is obtained.

FIG. 2 is a timing diagram illustrating a known read training method.

An internal data clock RD SYNC. CLK is used in the semiconductor memory device controller in order to receive a read data from the semiconductor memory device. The internal data clock RD SYNC. CLK is generated by compensating the external data clock EXTERNAL WCLK for an internal asynchronous delay INTERNAL ASYNC DELAY. The internal asynchronous delay INTERNAL ASYNC DELAY is caused in a path through which the external data clock EXTERNAL WCLK is transferred inside the semiconductor memory device. The internal asynchronous delay INTERNAL ASYNC DELAY is a value which varies depending on pressure, voltage, and temperature (PVT) variations. Therefore, the value cannot be previously determined, and instead is determined through a read training.

When the semiconductor memory device is supplied with power and starts its operations, the semiconductor memory device controller and the semiconductor memory device perform the read training. The read training is an operation to find an optimum timing of generating a read strobe signal GPU READ STROBE based on the external data clock EXTERNAL WCLK. The read strobe signal GPU READ STROBE determines a valid window of the read data based on the internal data clock RD SYNC. CLK. After finding the optimum timing of generating the read strobe signal GPU READ STROBE, the semiconductor memory device starts to read the read data outputted from the semiconductor memory device controller. Meanwhile, in the case of a semiconductor memory device including a plurality of banks, a total current consumption of the semiconductor memory device changes according to the number of banks activated among the plurality of banks. Accordingly, a level of a voltage used in the semiconductor memory device may change.

For example, as the number of banks activated among the plurality of banks increases, the total current consumption of the semiconductor memory device increases. Accordingly, the level of the voltage used in the semiconductor memory device may decrease. On the contrary, as the number of banks activated among the plurality of banks decreases, the total current consumption of the semiconductor memory device decreases. Accordingly, the level of the voltage used in the semiconductor memory device may increase.

When the current amount and the voltage level used in the semiconductor memory device changes, a clock delay, which may be applied to an external data clock EXTERNAL WCLK in order to generate optimum read/write internal data clocks RD/WT SYNC. CLK through the write training and the read training at the initial stage of operation of the semiconductor memory device, may also change. Therefore, a sufficient setup/hold time may not be ensured at a window period of a write data, and a position of a strobe signal, which may determine an optimal value in a window period of a read data, may be undesirably shifted.

SUMMARY OF THE INVENTION

Exemplary embodiments of the present invention are directed to a semiconductor memory device which is capable of adjusting a delay between an external data clock (EXTERNAL WCLK) and a read/write internal data clock (RD/WT Sync. CLK).

In accordance with an exemplary embodiment of the present invention, a semiconductor memory device includes a plurality of banks, a clock input unit configured to receive an external data clock; an internal data clock generation unit configured to receive the external data clock from the clock input unit and generate an internal data clock by delaying the external data clock by a delay amount which changes in correspondence to the number of banks activated among the plurality of banks, and a data buffer unit configured to buffer a data signal in response to the internal data clock.

In accordance with another exemplary embodiment of the present invention, a semiconductor memory device includes a plurality of banks, a clock input unit configured to receive an external data clock; a clock phase mixing unit configured to receive the external data clock, mix a phase of the external data clock and a phase of a delayed external data clock at a ratio corresponding to the number of the banks activated among the plurality of banks, and output a phase-mixed data clock as an internal data clock, wherein the delayed external data clock is generated by delaying the external data clock by a preset time, and a data buffer unit configured to buffer a data signal in response to the internal data clock.

In accordance with yet another exemplary embodiment of the present invention, a method for operating a semiconductor memory device having a first bank and a second bank includes outputting an internal data clock by delaying an external data clock by a first preset time when one of the first bank and the second bank is activated, outputting the internal data clock by delaying the external data clock by a second preset time longer than the first preset time when both the first bank and the second bank are activated, and inputting/outputting a data signal in response to the internal data clock.

BRIEF DESCRIPTION OF THE DRAWINGS

FIG. 5 is a timing diagram illustrating the operation of the semiconductor memory devices shown in FIGS. 3 and 4.

DESCRIPTION OF SPECIFIC EMBODIMENTS

Figure 1:
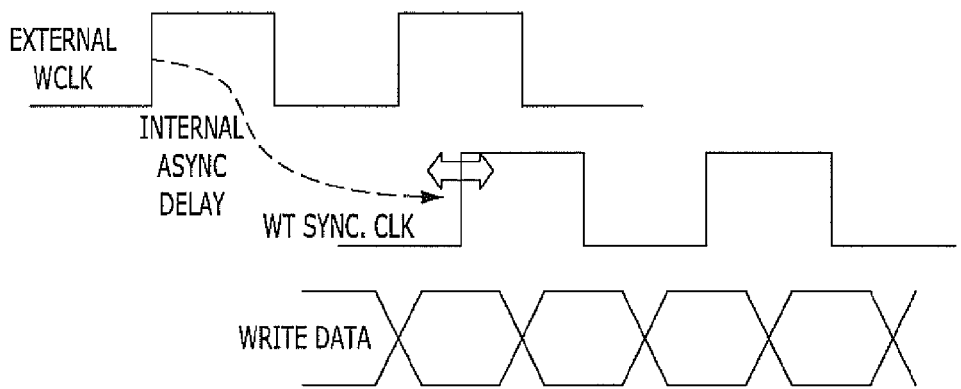
FIG. 1 is a timing diagram illustrating a known write training method.
Figure 2:
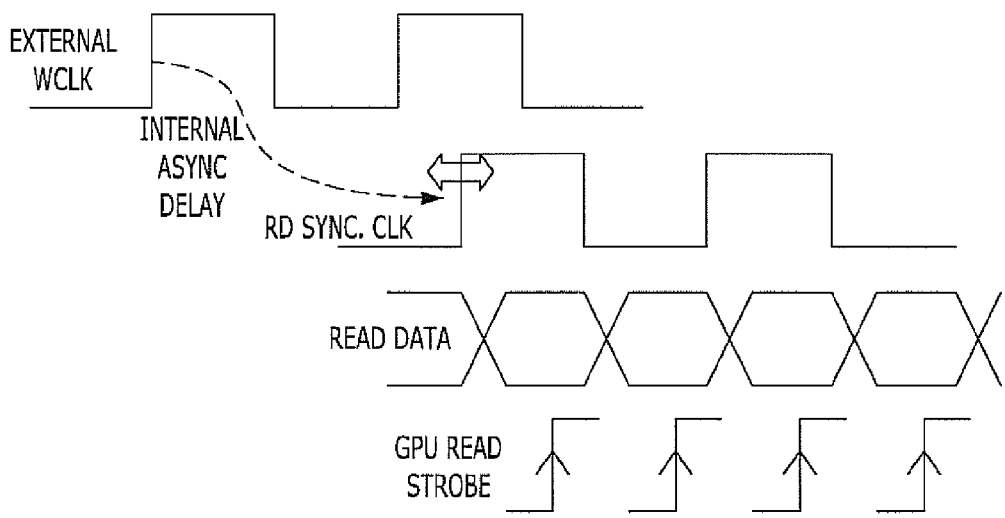
FIG. 2 is a timing diagram illustrating a known read training method.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
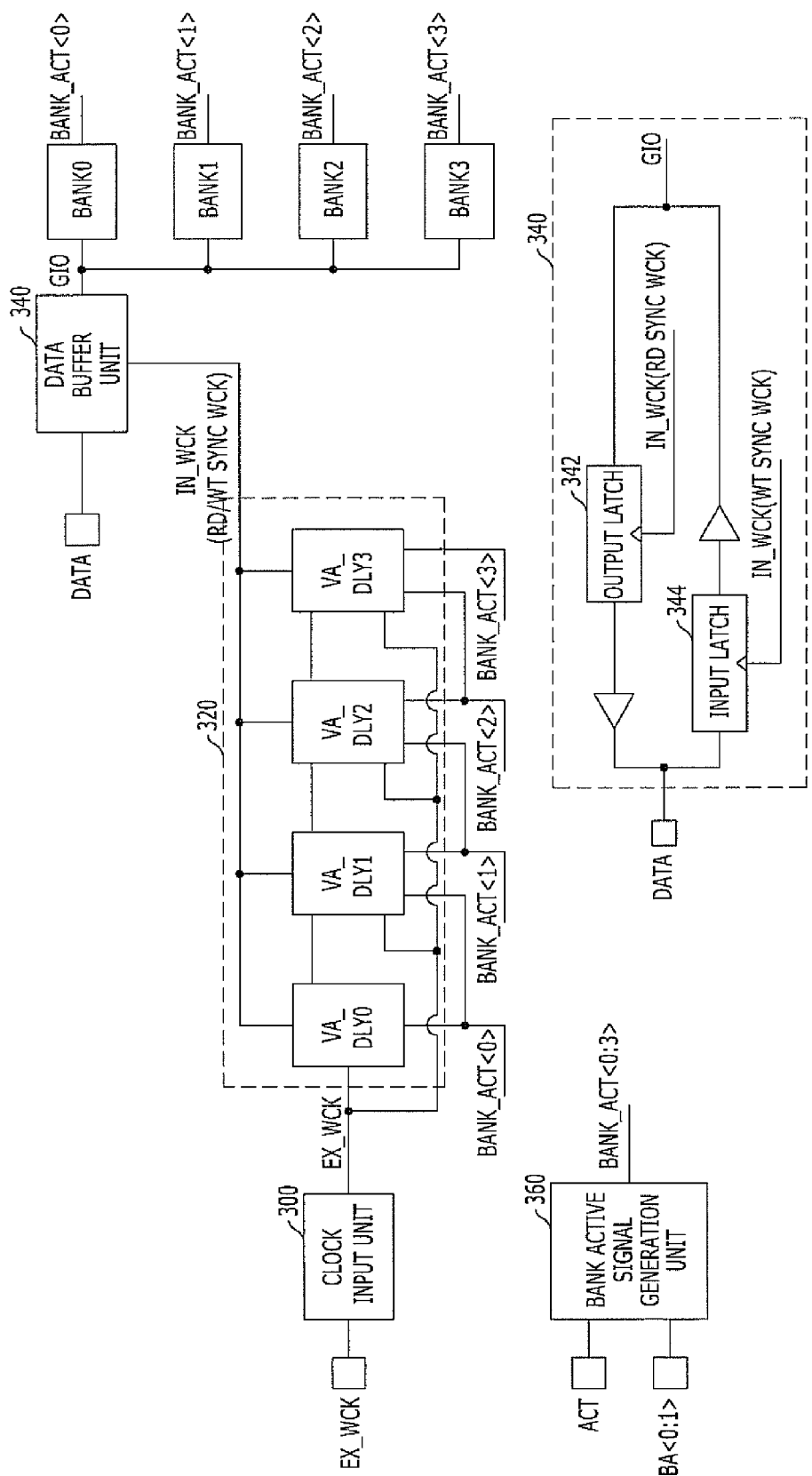
FIG. 3 is a block diagram of a semiconductor memory device in accordance with a first exemplary embodiment of the present invention.

FIG. 3 is a block diagram of a semiconductor memory device in accordance with an exemplary embodiment of the present invention.

For reference, FIG. 3 is a block diagram emphasizing a part in which an external data clock EX_WCK is transferred to the inside of a semiconductor memory device and outputted as an internal data clock IN_WCK for inputting/outputting a data signal DATA. At this time, an asynchronous delay of a clock transfer path inside the semiconductor memory device, which must be compensated from the external data clock EX_WCK, occurs due to the internal blocks of the semiconductor memory device illustrated in FIG. 3.

Referring to FIG. 3, the semiconductor memory device includes a plurality of banks BANK0, BANK1, BANK2, and BANK3, a clock input unit 300, an internal data clock generation unit 320, and a data buffer unit 340. The clock input unit 300 is configured to receive an external data clock EX_WCK. The internal data clock generation unit 320 is configured to receive the external data clock EX_WCK from the clock input unit 300 and generate an internal data clock IN_WCK by delaying the external data clock EX_WCK by a delay amount which varies in correspondence to the number of banks activated among the plurality of banks BANK0, BANK1, BANK2, and BANK3. The data buffer unit 340 is configured to buffer a data signal DATA in response to the internal data clock IN_WCK. The data buffer unit includes an output latch 342 and an input latch 344 which are configured to output and input the data signal DATA to input/output buffers in response to the internal data clock IN_WCK.

In addition, the semiconductor memory device further includes a bank active signal generation unit 360 which is configured to control the active operations of the banks BANK0, BANK1, BANK2, and BANK3 and generate a plurality of bank active signals BANK_ACT<0:3> in response to an active command ACT and a bank address signal BA<0:1>.

When the number of the banks activated among the plurality of banks BANK0, BANK1, BANK2, and BANK3 is relatively large, a relatively large amount of a current is used in the semiconductor memory device. Thus, a level of a power supply voltage supplied to the semiconductor memory device is decreased. As such, when the amount of the current used in the semiconductor memory device increases and the level of the power supply voltage supplied to the semiconductor memory device decreases due to a relatively large number of the banks activated among the plurality of banks BANK0, BANK1, BANK2, and BANK3, a data read/write speed of the banks BANK0, BANK1, BANK2, and BANK3 is gradually decreases.

On the other hand, when the number of the banks activated among the plurality of banks BANK0, BANK1, BANK2, and BANK3 is relatively small, an amount of a current used in the semiconductor memory device is relatively small. Thus, the level of the power supply voltage supplied to the semiconductor memory device is increased. As such, when the amount of the current used in the semiconductor memory device decreases and the level of the power supply voltage supplied to the semiconductor memory device increases due to a relatively small number of the banks activated among the plurality of banks BANK0, BANK1, BANK2, and BANK3, a data read/write speed of the banks BANK0, BANK1, BANK2, and BANK3 gradually increases.

Therefore, data read/written in the plurality of banks BANK0, BANK1, BANK2, and BANK3 are synchronized by using the internal data clock IN_WCK generated by delaying the external data clock EX_WCK according to the number of the banks activated among the plurality of banks BANK0, BANK1, BANK2, and BANK3, instead of using the external data clock EX_WCK.

For example, when the number of the banks activated among the plurality of banks BANK0, BANK1, BANK2, and BANK3 is relatively large, the internal data clock IN_WCK is generated by delaying the external data clock EX_WCK by a relatively large delay amount, thereby compensating for a relatively slow data read/write speed in the plurality of banks BANK0, BANK1, BANK2, and BANK3. On the other hand, when the number of the banks activated among the plurality of banks BANK0, BANK1, BANK2, and BANK3 is relatively small, the internal data clock IN_WCK is generated by delaying the external data clock EX_WCK by a relatively small delay amount, thereby compensating for a relatively fast data read/write speed in the plurality of banks BANK0, BANK1, BANK2, and BANK3.

For reference, the number of the banks activated among the plurality of banks BANK0, BANK1, BANK2, and BANK3 can be known using the plurality of bank active signals BANK_ACT<0:3> generated for activating the plurality of banks BANK0, BANK1, BANK2, and BANK3.

The internal data clock generation unit 320 outputs the internal data clock IN_WCK in response to the plurality of bank active signals BANK_ACT<0:3> by delaying the external data clock EX_WCK through variable delay circuits VA_DLY0, VA_DLY1, VA_DLY2, and VA_DLY3 whose delay amount change stepwise.

As the number of the signals activated among the plurality of bank active signals BANK_ACT<0:3> increases, the variable delay circuits VA_DLY0, VA_DLY1, VA_DLY2, and VA_DLY3 have a larger delay amount. As the number of the signals activated among the plurality of bank active signals BANK_ACT<0:3> decreases, the variable delay circuits VA_DLY0, VA_DLY1, VA_DLY2, and VA_DLY3 have a smaller delay amount.

For example, when the zeroth bank BANK0 and the first bank BANK1 are activated and the second bank BANK2 and the third bank BANK3 are not activated, the zeroth bank active signal BANK_ACT<0> and the first bank active signal BANK<1> are activated, and the second bank active signal BANK_ACT<2> and the third bank active signal BANK_ACT<3> are deactivated. Therefore, the variable delay circuits VA_DLY0, VA_DLY1, VA_DLY2, and VA_DLY3 output the internal data clock IN_WCK by delaying the external data clock EX_WCK by two-step delay amounts of the variable delay circuits VA_DLY0 and VA_DLY1, which is activated.

On the other hand, when the third bank BANK3 is activated and the zeroth, first and second banks BANK0, BANK1 and BANK2 are not activated, the third bank active signal BANK_ACT<3> is activated, and the zeroth, first and second bank active signals BANK_ACT<0>, BANK_ACT<1> and BANK_ACT<2> are deactivated. Therefore, the variable delay circuits VA_DLY0, VA_DLY1, VA_DLY2, and VA_DLY3 output the internal data clock IN_WCK by delaying the external data clock EX_WCK by one-step delay amount of the variable delay circuit VA_DLY3, which is activated.

Figure 4:
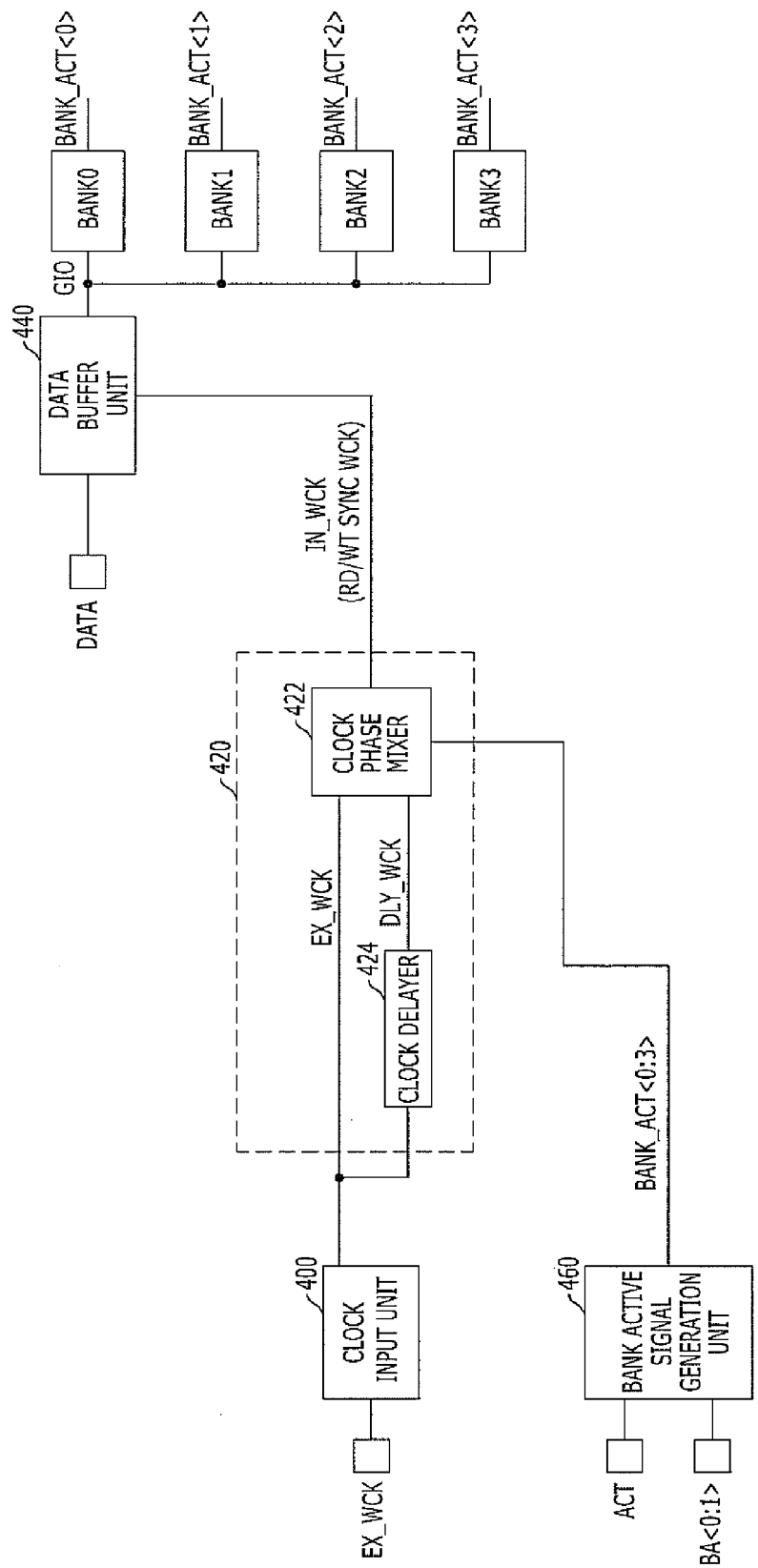
FIG. 4 is a block diagram of a semiconductor memory device in accordance with another exemplary embodiment of the present invention.

FIG. 4 is a block diagram of a semiconductor memory device in accordance with another exemplary embodiment of the present invention.

FIG. 4 is a block diagram emphasizing a part in which an external data clock EX_WCK is transferred to the inside of a semiconductor memory device and outputted as an internal data clock IN_WCK for inputting/outputting a data signal DATA. At this time, an asynchronous delay of a clock transfer path inside the semiconductor memory device, which must be compensated from the external data clock EX_WCK, occurs due to the internal blocks of the semiconductor memory device illustrated in FIG. 4.

Referring to FIG. 4, the semiconductor memory device in accordance with the second exemplary embodiment of the present invention includes a plurality of banks BANK0, BANK1, BANK2, and BANK3, a clock input unit 400, a clock phase mixing unit 420, and a data buffer unit 440. The clock input unit 400 is configured to receive an external data clock EX_WCK. The clock phase mixing unit 420 is configured to receive the external data clock EX_WCK and a delayed data clock DLY_WCK, which is generated by delaying the external data clock EX_WCK by a preset time, mix a phase of the external data clock EX_WCK and a phase of the delayed data clock DLY_WCK at a ratio corresponding to the number of the banks activated among the plurality of banks BANK0, BANK1, BANK2, and BANK3, and output a phase-mixed data clock as an internal data clock IN_WCK. The data input/output unit 440 is configured to buffer a data signal DATA in response to the internal data clock IN_WCK. Although, for the sake of convenience, a detailed diagram for the data buffer unit 440 is omitted, the data buffer unit 440 may have the same configuration as the data buffer unit 340 shown in FIG. 3.

In addition, the semiconductor memory device further includes a bank active signal generation unit 460 configured to control the active operations of the banks BANK0, BANK1, BANK2, and BANK3 and generate a plurality of bank active signals BANK_ACT<0:3> in response to an active command ACT and a bank address signal BA<0:1>.

When the number of the banks activated among the plurality of banks BANK0, BANK1, BANK2, and BANK3 is relatively large, an amount of a current used in the semiconductor memory device is relatively large. Thus, a level of a power supply voltage supplied to the semiconductor memory device decreases. As such, when the amount of the current used in the semiconductor memory device increases and the level of the power supply voltage supplied to the semiconductor memory device decreases due to a relatively large number of the banks activated among the plurality of banks BANK0, BANK1, BANK2, and BANK3, a data read/write speed of the banks BANK0, BANK1, BANK2, and BANK3 is gradually reduced.

On the other hand, when the number of the banks activated among the plurality of banks BANK0, BANK1, BANK2, and BANK3 is relatively small, the amount of a current used in the semiconductor memory device is relatively small. Thus, the level of the power supply voltage supplied to the semiconductor memory device increases. As such, when the amount of the current used in the semiconductor memory device decreases and the level of the power supply voltage supplied to the semiconductor memory device increases due to a relatively small number of the banks activated among the plurality of banks BANK0, BANK1, BANK2, and BANK3, a data read/write speed of the banks BANK0, BANK1, BANK2, and BANK3 is gradually increased.

Therefore, data read/written in the plurality of banks BANK0, BANK1, BANK2, and BANK3 are synchronized using the internal data clock IN_WCK generated by delaying the external data clock EX_WCK according to the number of the banks activated among the plurality of banks BANK0, BANK1, BANK2, and BANK3, instead of using the external data clock EX_WCK.

For example, when the number of the banks activated among the plurality of banks BANK0, BANK1, BANK2, and BANK3 is relatively large, the internal data clock IN_WCK is generated by delaying the external data clock EX_WCK by a relatively large delay amount, thereby compensating for a relatively slow data read/write speed in the plurality of banks BANK0, BANK1, BANK2, and BANK3. On the other hand, when the number of the banks activated among the plurality of banks BANK0, BANK1, BANK2, and BANK3 is relatively small, the internal data clock IN_WCK is generated by delaying the external data clock EX_WCK by a relatively small delay amount, thereby compensating for a relatively fast data read/write speed in the plurality of banks BANK0, BANK1, BANK2, and BANK3.

For reference, the number of the banks activated among the plurality of banks BANK0, BANK1, BANK2, and BANK3 may be known using the plurality of bank active signals BANK_ACT<0:3> generated for activating the plurality of banks BANK0, BANK1, BANK2, and BANK3.

The clock phase mixing unit 420 includes a clock delayer 424 and a clock phase mixer 422. The clock delayer 424 is configured to generate a delayed external data clock DLY_WCK by delaying the external data clock EX_WCK by a preset time. The clock phase mixer 422 is configured to output the internal data clock IN_WCK by mixing the phase of the external data clock EX_WCK and the phase of the delayed external data clock DLY_WCK at the ratio corresponding to the number of the bank active signals activated among the plurality of bank active signals BANK_ACT<0:3>.

As the number of the signals activated among the plurality of bank active signals BANK_ACT<0:3> decreases, the clock phase mixer 422 generates the internal data clock IN_WCK by mixing the external data clock EX_WCK with a relatively higher drivability and the delayed external data clock DLY_WCK with a relatively lower drivability. That is, as the number of the signals activated among the plurality of bank active signals BANK_ACT<0:3> decreases, the clock phase mixer 422 performs a control operation so that the phase of the internal data clock IN_WCK slightly lags behind the phase of the external data clock EX_WCK and greatly leads the phase of the delayed external data clock DLY_WCK.

On the other hand, as the number of the signals activated among the plurality of bank active signals BANK_ACT<0:3> increases, the clock phase mixer 422 generates the internal data clock IN_WCK by mixing the external data clock EX_WCK with a relatively lower drivability and the delayed external data clock DLY_WCK with a relatively higher drivability. That is, as the number of the signals activated among the plurality of bank active signals BANK_ACT<0:3> increases, the clock phase mixer 422 performs a control operation so that the phase of the internal data clock IN_WCK greatly lags behind the phase of the external data clock EX_WCK and slightly leads the phase of the delayed external data clock DLY_WCK.

For example, when the zeroth bank BANK0 and the first bank BANK1 are activated and the second bank BANK2 and the third bank BANK3 are not activated, the zeroth bank active signal BANK_ACT<0> and the first bank active signal BANK<1> are activated, and the second bank active signal BANK_ACT<2> and the third bank active signal BANK_ACT<3> are deactivated. That is, the number of the activated bank active signals BANK_ACT<0:1> is equal to the number of the deactivated bank active signals BANK_ACT<2:3>. Therefore, the clock phase mixer 422 drives the external data clock EX_WCK and the delayed external data clock DLY_WCK with the same drivability, and the phase of the internal data clock IN_WCK is positioned in the exact center between the phase of the external data clock EX_WCK and the phase of the delayed external data delay clock DLY_WCK.

On the other hand, when the third bank BANK3 is activated and the zeroth, first, and second banks BANK0, BANK1, and BANK2 are not activated, the third bank active signal BANK_ACT<3> is activated, and the zeroth, first, and second bank active signals BANK_ACT<0>, BANK_ACT<1> and BANK_ACT<2> are deactivated. That is, the number of the deactivated signals (BANK_ACT<0:2>) is larger than the number of the activated signals (BANK_ACT<3>). Therefore, the clock phase mixer 422 drives the external data clock EX_WCK with a relatively high drivability and drives the delayed external data clock DLY_WCK with a relatively low drivability, and the phase of the internal data clock IN_WCK leans toward the phase of the external data clock EX_WCK by ¼ between the phase of the external data clock EX_WCK and the phase of the delayed external data clock DLY_WCK.

In addition, when the third bank BANK3 is deactivated and the zeroth, first, and second banks BANK0, BANK1, and BANK2 are activated, the third bank active signal BANK_ACT<3> is deactivated, and the zeroth, first, and second bank active signals BANK_ACT<0>, BANK_ACT<1>, and BANK_ACT<2> are activated. That is, the number of the activated signals (BANK_ACT<0:2>) is larger than the number of the deactivated signals (BANK_ACT<3>). Therefore, the clock phase mixer 422 drives the external data clock EX_WCK with a relatively low drivability and drives the delayed external data clock DLY_WCK with a relatively high drivability, and the phase of the internal data clock IN_WCK leans toward the phase of the delayed external data clock DLY_WCK by ¼ between the phase of the external data clock EX_WCK and the phase of the delayed external data clock DLY_WCK.

FIG. 5 is a timing diagram illustrating the operation of the semiconductor memory devices of FIGS. 3 and 4.

Referring to FIG. 5, when all the banks BANK0, BANK1, BANK2, and BANK3 in the semiconductor memory device are in a deactivated state, the power supply voltage is maintained at the highest level and the delay amount of the external data clock EX_WCK for generating the internal data clock IN_WCK is maintained at the smallest value.

When the zeroth bank BANK0 among the plurality of banks BANK0, BANK1, BANK2, and BANK3 is activated, the level of the power supply voltage VDD slightly drops. Accordingly, the delay amount of the external data clock EX_WCK for generating the internal data clock IN_WCK increases by a set value.

When the zeroth and first banks BANK0 and BANK1 among the plurality of banks BANK0, BANK1, BANK2, and BANK3 are activated, the level of the power supply voltage VDD further drops. Therefore, the delay amount of the external data clock EX_WCK for generating the internal data clock IN_WCK further increases by a preset value.

As the number of the banks activated among the plurality of banks BANK0, BANK1, BANK2, and BANK3 increases, the level of the power supply voltage VDD further decreases. Accordingly, the semiconductor memory device operates to increase the delay amount of the external data clock EX_WCK.

In accordance with the exemplary embodiment of the present invention, when the external data clock EX_WCK changes to the internal data clock (RD/WT SYNC WCLK), the external data clock EX_WCK is delayed by a delay amount varying according to the number of the banks activated among the plurality of banks provided within the semiconductor memory device. The delay amount difference between the external data clock EX_WCK and the internal data clock IN_WCK is a delay caused by passing the external data clock EX_WCK through the semiconductor memory device and may be changed according to the number of the banks activated among the plurality of banks BANK0, BANK1, BANK2, and BANK3.

The increase in the number of the banks activated among the plurality of banks BANK0, BANK1, BANK2, and BANK3 provided within the semiconductor memory device means that the amount of the current used in the semiconductor memory device increases and the level of the internal power supply voltage decreases. Therefore, when the amount of the current used in the semiconductor memory device increases or the level of the internal power supply voltage decreases, the delay amount between the external data clock EX_WCK and the internal data clock IN_WCK may be increased. On the other hand, when the amount of the current used in the semiconductor memory device decreases or the level of the internal power supply voltage increases, the delay amount between the external data clock EX_WCK and the internal data clock IN_WCK may be decreased.

That is, the delay amount between the external data clock EX_WCK and the internal data clock IN_WCK is automatically changed according to the amount of the current used in the semiconductor memory device and the level of the internal power supply voltage. The delay amount between the external data clock EX_WCK and the read/write internal data clock IN_WCK may be maintained at the optimum state, although the change occurs in the number of the banks activated among the plurality of banks BANK0, BANK1, BANK2, and BANK3 provided in the semiconductor memory device.

Therefore, a sufficient setup/hold time is always ensured in the write data, although the change occurs in the number of the banks activated among the plurality of banks BANK0, BANK1, BANK2, and BANK3 provided in the semiconductor memory device. In addition, the position of the strobe signal, which can determine the optimum data output valid window, is always determined in the read data.

In addition, although it has been described in the above exemplary embodiments of the present invention that the change in the amount of the current used in the semiconductor memory device and the level of the internal power supply voltage is detected based on the number of the banks activated among the plurality of banks BANK0, BANK1, BANK2, and BANK3 provided in the semiconductor memory device, this is done to better define the specific operation of the semiconductor memory device. The embodiments of the present invention can also be applied to a scheme in which the delay amount between the external data clock EX_WCK and the internal data clock IN_WCK may be automatically changed in an operation mode in which the amount of the current used in the semiconductor memory device greatly increases (or an operation mode in which the level of the internal power supply voltage greatly changes).

While the present invention has been described with respect to the specific embodiments, it will be apparent to those skilled in the art that various changes and modifications may be made without departing from the spirit and scope of the invention as defined in the following claims.

In the foregoing embodiments, the positions and types of the logic gates and transistors may be differently implemented depending on the polarities of the input signals thereof.

What is claimed is:

1. A semiconductor memory device, comprising:
a plurality of banks;
a clock input unit configured to receive an external data clock;
an internal data clock generation unit configured to receive the external data clock from the clock input unit and generate an internal data clock by delaying the external data clock by a delay amount which changes in correspondence to the number of banks activated among the plurality of banks; and
a data buffer unit configured to buffer a data signal in response to the internal data clock.

2. The semiconductor memory device of claim 1, further comprising a bank active signal generation unit configured to control active operations of the banks and generate a plurality of bank active signals in response to an active command and a bank address signal.

3. The semiconductor memory device of claim 2, wherein the internal data clock generation unit comprises a variable delay circuit configured to delay the external data clock by a delay amount which changes stepwise in response to the plurality of bank active signals and output the internal data clock.

4. The semiconductor memory device of claim 3, wherein the variable delay circuit has a greater delay amount as the number of the signals activated among the plurality of bank active signals increases, and has a smaller delay amount as the number of the signals activated among the plurality of bank active signals decreases.

5. The semiconductor memory device of claim 3, wherein the variable delay circuit comprises a plurality of delay units and each of the delay units has a preset delay amount and is activated in response to a corresponding bank active signal.

6. The semiconductor memory device of claim 1, wherein the data buffer unit includes:
an output latch configured to output the data signal in response to the internal data clock; and
an input latch configured to input the data signal in response to the internal clock signal.

7. A semiconductor memory device, comprising:
a plurality of banks;
a clock input unit configured to receive an external data clock;
a clock phase mixing unit configured to receive the external data clock, mix a phase of the external data clock and a phase of a delayed external data clock at a ratio corresponding to the number of the banks activated among the plurality of banks, and output a phase-mixed data clock as an internal data clock, wherein the delayed external data clock is generated by delaying the external data clock by a preset time; and a data buffer unit configured to buffer a data signal in response to the internal data clock.

8. The semiconductor memory device of claim 7, further comprising a bank active signal generation unit configured to control active operations of the banks and generate a plurality of bank active signals in response to an active command and a bank address signal.

9. The semiconductor memory device of claim 8, wherein the clock phase mixing unit comprises:

a clock delayer configured to generate the delayed external data clock by delaying the external data clock by the preset time; and a clock phase mixer configured to output the internal data clock by mixing the phase of the external data clock and the phase of the delayed external data clock at the ratio corresponding to the number of the signals activated among the plurality of bank active signals.

10. The semiconductor memory device of claim 9, wherein, as the number of the signals activated among the plurality of bank active signals decreases, the clock phase mixer generates the internal data clock by mixing the external data clock with a relatively higher drivability and the delayed external data clock with a relatively lower drivability.

11. The semiconductor memory device of claim 10, wherein, as the number of the signals activated among the plurality of bank active signals increases, the clock phase mixer generates the internal data clock by mixing the external data clock with a relatively lower drivability and the delayed external data delay clock with a relatively higher drivability.

12. The semiconductor memory device of claim 10, wherein, as the number of the signals activated among the plurality of bank active signals decreases, the clock phase mixer performs a control operation so that the phase of the internal data clock relatively and slightly lags behind the phase of the external data clock and relatively and greatly leads the phase of the external data delay clock.

13. The semiconductor memory device of claim 12, wherein, as the number of the signals activated among the plurality of bank active signals increases, the clock phase mixer performs a control operation so that the phase of the internal data clock relatively and greatly lags behind the phase of the external data clock and relatively and slightly leads the phase of the external data delay clock.

14. The semiconductor memory device of claim of claim 7, wherein the data buffer unit includes:

an output latch configured to output the data signal in response to the internal data clock; and an input latch configured to input the data signal in response to the internal clock signal.

15. A method for operating a semiconductor memory device having a first bank and a second bank, the method comprising:

outputting an internal data clock by delaying an external data clock by a first preset time when one of the first bank and the second bank is activated;

outputting the internal data clock by delaying the external data clock by a second preset time longer than the first preset time when both the first bank and the second bank are activated; and buffering a data signal in response to the internal data clock.

16. The method of claim 15, further comprising outputting the external data clock as the internal data clock when both the first bank and the second bank are deactivated.

* * * * *